SEMICONDUCTOR COUNTING CIRCUITS USING A DIODE MATRIX

Filed April 19, 1962 3 Sheets-Sheet 1

INVENTOR.
ARPAD SOMLYODY
BY Robert A. Green
ATTORNEY

INVENTOR.
ARPAD SOMLYODY
BY Robert A. Green
ATTORNEY

INVENTOR.
ARPAD SOMLYODY
BY Robert A. Green
ATTORNEY

United States Patent Office 3,192,406
Patented June 29, 1965

3,192,406
SEMICONDUCTOR COUNTING CIRCUITS USING A DIODE MATRIX

Arpad Somlyody, Raritan, N.J., assignor to Burroughs Corporation, Detroit, Mich., a corporation of Michigan
Filed Apr. 19, 1962, Ser. No. 188,739
10 Claims. (Cl. 307—88.5)

This invention relates to electronic counting circuits and particularly to semiconductor counting circuits.

One type of electronic semiconductor counter recently devised utilizes a diode matrix to transmit counting signals to a plurality of transistors, or the like, one transistor being provided for each counting step to provide decimal output logic. Such a circuit can be coupled directly to a decimal readout or indicator device to provide a direct visual indication of the counting operation. The diode matrix also serves to interrelate the transistors and thereby aid the counting operation and affect the direction in which the counting operation proceeds. Up to the present time, a flip-flop circuit has been used to apply counting pulses to the counter circuit and to assist in the performance of the counting operation by each transistor. This type of circuit operates quite satisfactorily. However, there is an ever-present need to reduce the size, complexity, and the number of components in circuits of the type under consideration. In addition, prior art semiconductor counters are generally not readily reversible, and it is desirable to be able to reverse a counter.

The objects of the present invention concern the provision of a semiconductor counter utilizing a diode matrix and characterized by greater simplicity than similar circuits in the prior art.

The objects of the present invention also concern the provision of an improved and simplified reversible semiconductor counter.

Briefly, a counter circuit embodying the invention includes a plurality of count registering devices, each of which comprises a separate step in a counting chain. Each count registering device includes an input and output electrode, and the output electrode of each counting device is coupled through a diode matrix to all of the other counting devices so that only one counting device performs the counting operation at a time. Each counting device is also coupled to the next adjacent counting device in the counting order in such a way as to insure that the counting operation proceeds in the proper order from one device to the next. With this coupling arrangement between the separate counting devices, a single source of counting pulses serves to cause the counting operation to take place.

The counter circuit may also be adapted to count in a reverse direction by including an auxiliary coupling arrangement between the counting devices and a second source of counting pulses.

The invention is described in greater detail by reference to the drawing wherein.

Figure 1:
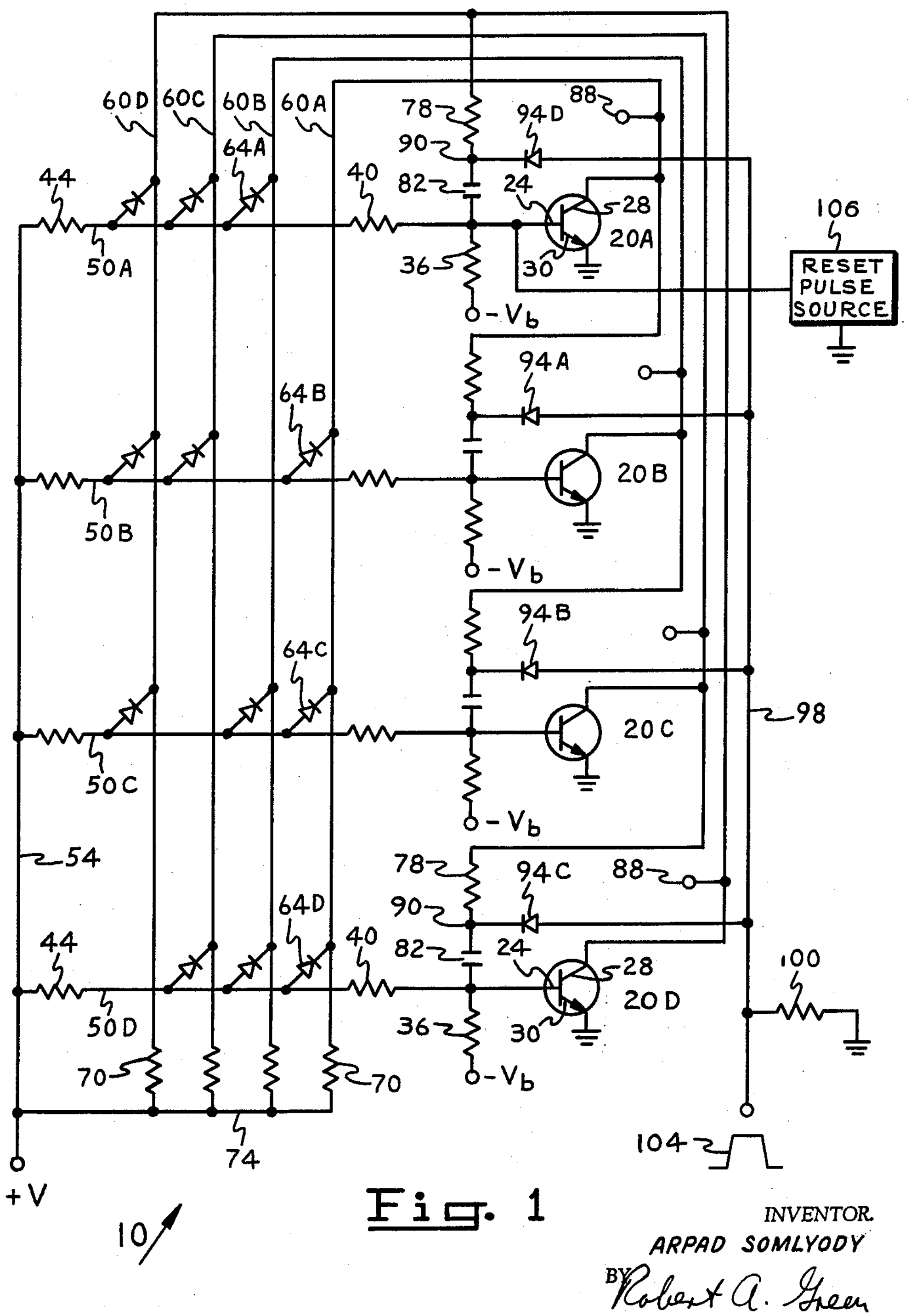
FIG. 1 is a schematic representation of a counter circuit embodying the invention.

Referring to FIG. 1, a counter circuit 10 embodying the invention includes a plurality of count registering discharge devices 20 which may be semiconductor devices such as transistors or the like which operate generally in the nature of switches. For convenience, NPN transistors are shown as the counting devices; however, it is clear that other types of semiconductor devices could be used. Each transistor is adapted to register one count, and the total number of transistors provided in the counting chain is determined by the total number of counts to be executed in a complete counting cycle. For convenience, only four counting steps are shown including transistors 20A, 20B, 20C, and 20D.

Each transistor includes base, collector, and emitter electrodes, 24, 28, and 30, respectively. Each base electrode is coupled through a resistor 36 to a negative D.C. power source $V_b$ through a resistor network 40 and 44 and lead 50 to a bus 54 which is coupled to a positive D.C. power source V. Each emitter electrode is connected to a source of reference potential such as ground.

The output or collector electrode 28 of each transistor is connected back through a lead 60 and a diode 64, oriented as shown, to the base electrode of each transistor except its own base electrode. Thus, the collector of transistor 20A is connected through lead 60 A and diodes 64B, 64C, and 64D to the base electrodes of transistors 20B, 20C, and 20D, respectively. Transistor 20B is similarly connected by lead 60B and diodes 64A, 64C, and 64D to the base electrodes of transistors 20A, 20C, and 20D, respectively. The other transistors are similarly connected. The leads 60A, 60B, 60C, and 60D are coupled through resistors 70 and bus 74 to power supply V.

Each output or collector electrode is also coupled by means of terminal 88 to a suitable utilization device, for example, a cold cathode indicator tube such as a type 6844A tube (not shown). Each collector electrode is also coupled through a resistor 78 and a capacitor 82 to the base electrode of the next adjacent transistor in the counting chain. Thus, the collector of transistor 20A is coupled to the base of 20B, the collector of 20B is coupled to the base of 20C, etc. In addition, the junction 90 between each resistor and capacitor is coupled through a diode 94, oriented as shown, to a lead 98 which is connected through a resistor 100 to ground and to a source (not shown) of positive counting pulses 104.

A source 106 of positive pulses which may be used either to set or reset the counter circuit 10 is coupled to the base electrode 24 of transistor 20A which is arbitrarily designated the first transistor in the counting cycle.

In operation of the circuit of the invention, considering the circuit before a counting operation is initiated, it can be seen that the power source V provides a positive potential at the base electrodes of the transistors 20. The anodes of the diodes 94 are at about ground potential and the cathodes thereof, which are coupled to collector electrodes, are at generally positive potentials when the transistors are not conducting. Thus, it can be seen that the diodes 94 are reverse-biased by a relatively large amount, for example 50 or 60 volts, and are, in effect, closed gates. The counter is set in operation by the application of a pulse from the source 106 to the base electrode of transistor 20A which is turned on thereby. When the transistor 20A is turned on, its collector electrode 28 is reduced to about ground potential, and this potential is coupled through lead 60A and diodes 64B, 64C, and 64D to the base electrodes of transistors 20B, 20C, and 20D, respectively which are thus held off. The potential of the collector electrode 28 of transistor 20A is also applied to the cathode of the associated diode 94A which is still reverse-biased but by a relatively small amount, for example, less than one volt. Thus, the diode 94A may be considered to be prebiased or primed so that, when a positive counting pulse 104, of perhaps 40 volts, is applied to the lead 98 and thus to all of the diodes 94, only the primed diode 94A can couple this pulse to the base electrode of transistor 20B. Thus, only transistor 20B can be turned on. The resulting drop in potential of the collector electrode of transistor 20B now operating through lead 60B and diodes 64 holds off all of the other transistors and primes the next successive diode 94B coupled between transistor 20B and 20C. Thus, the next counting pulse turns on transistor 20C. In this way, each successive counting pulse causes the count to be transmitted from one transistor to the next in order.

Figure 2:
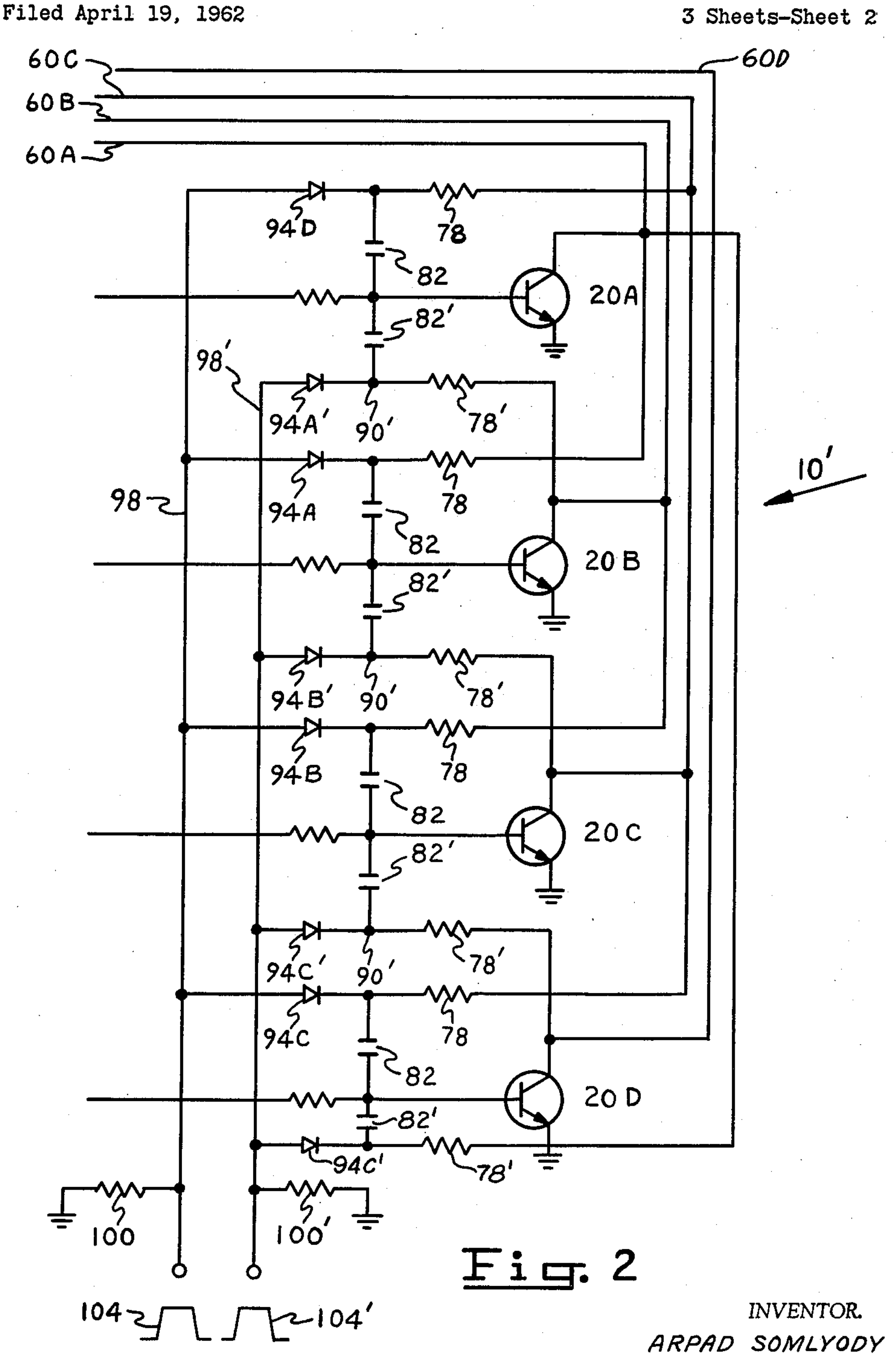
FIG. 2 is a schematic representation of a reversible counter embodying the invention.

The circuit described above may also be adapted to operate as a reversible counter. The reversible counter circuit 10′ shown in FIG. 2 includes all of the circuit elements of FIG. 1 and, in addition, an auxiliary coupling arrangement between counter stages to permit counting in the reverse direction from transistor 20D to 20C to 20B to 20A, etc. In the auxiliary coupling arrangement, each collector electrode 28 of each transistor 20 is coupled through a resistor-capacitor-diode network to the base electrode of the next adjacent transistor in the reverse counting order. Thus, the collector electrode of transistor 20D is connected through a resistor 78′ and capacitor 82′ to the base electrode of transistor 20C. The collector electrode of transistor 20C is connected through a resistor 78′ and capacitor 82′ to the base electrode of transistor 20B, etc. In addition, the junction 90′ of each resistor 78′ and capacitor 82′ is coupled through a diode 94′, oriented as shown, to a lead 98′ which is connected through a resistor 100′ to ground and to a source (not shown) of positive counting pulses 104′.

The operation of the reversible counter circuit of the invention is identical to that described above except that the direction in which the counting operation progresses is determined by the lead 98 or 98′, to which the counting pulses 104 and 104′ are applied. Thus, pulses applied to lead 98 cause the count to proceed in a forward direction from the transistor 20A to 20D, and pulses applied to lead 98′ cause the counting operation to proceed in a reverse direction from 20D to 20A.

Figure 3:
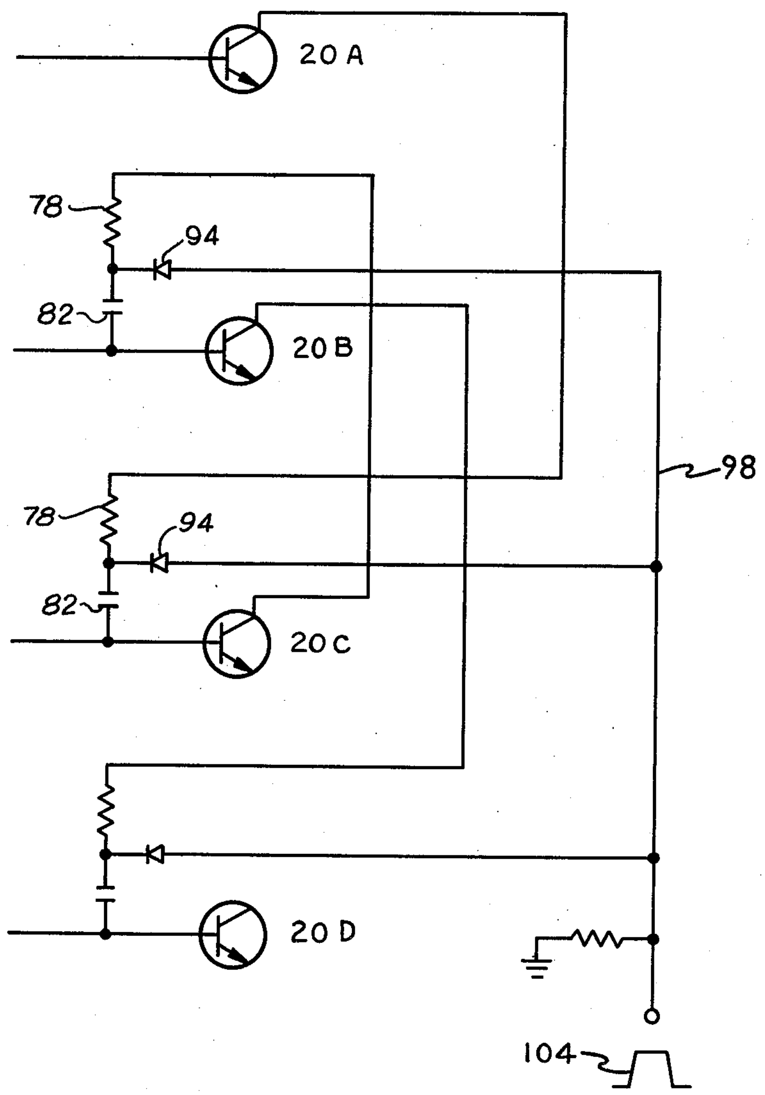
FIG. 3 is a schematic representation of a modification of the invention.

The principles of the invention may also be employed in a counter in which the counting steps are randomly arranged; that is, the count does not proceed from one counting step to the next adjacent counting step in order. A type of signal coding can be achieved in this way. This modification of the invention is shown in FIG. 3 and includes a plurality of counting transistors 20A to 20D. For purposes of illustration, it is assumed that the count proceeds from transistor 20A to transistor 20C, to transistor 20B, to transistor 20D. Thus, the collector electrode of transistor 20A is coupled through a resistor 78 and capacitor 82 to the base electrode of transistor 20C. The junction point of the resistor and capacitor is coupled through diode 94 to bus 98 which is connected to a source of switching pulses 104. The collector of transistor 20C is similarly coupled to the base electrode of transistor 20B, and the collector electrode of transistor 20B, is similarly coupled to the base electrode of transistor 20D, etc. It is clear that any counting order may be achieved in this way.

The present invention, described above, provides a novel and relatively simple reversible semiconductor counter using a diode matrix for facilitating the operation of the counter. It will be clear to those skilled in the art that various modifications may be made in the specific circuits described within the scope of the invention.

What is claimed is:

1. A counter circuit including
a plurality of counting devices arranged in a series for executing a counting cycle,
each device having an input electrode and an output electrode,
a separate gate coupled to the input electrode of each device,
a source of input pulses coupled to each gate and thus to the input electrode of each device for applying the same counting pulses to said devices simultaneously,
a first circuit connection from the output electrode of each device through a diode to the input electrode of every other device whereby as each device is turned on and performs a count registering operation, it holds off all other devices and thereby prevents all other devices from performing a count registering operation,
and a second circuit connection from the output electrode of each device through a resistor and a capacitor in series to the input electrode of the next adjacent device in the counting cycle whereby each device, as it performs a counting operation, prebiases another selected gate so that a counting pulse can be applied through said other selected gate to the input electrode of the discharge device associated therewith which may be turned on thereby.

2. The circuit defined in claim 1 wherein each gate is coupled between said source of input pulses and the junction of the resistor and capacitor coupled between adjacent counting devices.

3. A reversible counter circuit including
a plurality of counting devices arranged in a series and adapted to execute a counting cycle in one direction along the series or in the opposite direction along the series,
each device having an input electrode and an output electrode,
a first and a second gate coupled to the input electrode of each device, each of the first gates being operative when the counting cycle proceeds in the one direction along the series of devices, each of the second gates being operative when the counting cycle proceeds in the opposite direction along the series of devices,
a first signal source coupled to the first gate associated with each counting device to apply count signals to all of said devices simultaneously and to cause the counting operation to proceed in the one direction,
a second signal source coupled to the second gate associated with each counting device to apply count signals to all of said devices simultaneously and to cause the counting operation to proceed in the opposite direction,
a first circuit connection from the output electrode of each device through a diode to the input electrode of every other device whereby as each device performs a count registering operation, it prevents all other devices from performing this operation,
a second circuit connection from the output electrode of each device to the first gate and input electrode of the next adjacent device in the one direction in the counting cycle whereby each device as it performs a counting operation, biases the first gate of the next adjacent device in the one direction so that the next input pulse can be applied only through the first gate of said next adjacent device in the one direction and to the input electrode thereof so that the next adjacent device in the one direction and no other registers a count,
a third circuit connection from the output electrode of each device to the second gate and input electrode of the next adjacent device in the opposite direction in the counting cycle whereby each device, as it performs a counting operation, biases the second gate of the next adjacent device in the opposite direction so that the next input pulse can be applied only through the second gate of said next adjacent device in the opposite direction and to the input electrode thereof so that the next adjacent device in the opposite direction and no other registers a count,
and a fourth circuit connection from the output electrode of each device through a diode to the input electrode of every other device whereby, as each device performs a count registering operation, it prevents all other devices from performing this operation.

4. The circuit defined in claim 3 wherein said second circuit connection includes a series-connected resistor and capacitor with the associated first gate being connected to the junction of the resistor and capacitor, and said third circuit connection includes a series-connected resistor and capacitor with the associated second gate being connected to the junction of the resistor and capacitor.

5. The circuit defined in claim 3 wherein said second circuit connection includes a series-connected resistor and capacitor with the associated first gate comprising a diode connected to the junction of the resistor and capacitor, and said third circuit connection includes a series-connected resistor and capacitor with the associated second gate comprising a diode connected to the junction of the resistor and capacitor.

6. The circuit defined in claim 1 wherein each counting device comprises a transistor which has base, emitter, and collector electrodes, the base electrode comprising its input electrode and the collector electrode comprising its output electrode.

7. The circuit defined in claim 6 wherein the series resistor and capacitor network by which the output electrode of each register device is coupled to the input electrode of the next device in the counting order is coupled through a diode to a source of reference potential so that normally when a register device is not registering a count, the diode located between it and the next register device is reverse-biased and cannot pass a signal from said signal source, however, when a register device is in the state of registering a count, it pre-biases the diode coupled between it and the next register device in the counting chain so that the last-mentioned diode can pass a signal pulse which can be registered by said next register device.

8. The circuit defined in claim 1 wherein each counting device comprises a transistor which has base, emitter, and collector electrodes, the base electrode comprising its input electrode and the collector electrode comprising its output electrode.

9. The circuit defined in claim 3 wherein each counting device comprises a transistor which has base, emitter, and collector electrodes, the base electrode comprising its input electrode and the collector electrode comprising its output electrode.

10. The circuit defined in claim 3 wherein each counting device comprises a transistor which has base, emitter, and collector electrodes, the base electrode comprising its input electrode and the collector electrode comprising its output electrode.

References Cited by the Examiner

UNITED STATES PATENTS

| | | | |
|---|---|---|---|
| 2,399,473 | 4/46 | Desch et al. | 315—84.5 |
| 2,646,534 | 7/53 | Manley | 315—84.5 |
| 3,005,917 | 10/61 | Hofmann | 307—88.5 |
| 3,021,450 | 2/62 | Jiu | 315—84.5 |

ARTHUR GAUSS, *Primary Examiner.*

UNITED STATES PATENT OFFICE

CERTIFICATE OF CORRECTION

Patent No. 3,192,406 June 29, 1965

Arpad Somlyody

It is hereby certified that error appears in the above numbered patent requiring correction and that the said Letters Patent should read as corrected below.

Column 4, line 67, for "count," read -- count. --; column 4, line 68, beginning with "and a fourth" strike out all to and including "this operation." in line 73, same column 4; column 6, line 5, beginning with "8. The circuit" strike out all to and including "output electrode." in line 14, same column 6; same column 6, line 15, for "10. The circuit" read -- 8. The circuit --; in the heading to the printed specification, line 7, for "10 Claims." read -- 8 Claims. --.

Signed and sealed this 23rd day of November 1965.

(SEAL)
Attest:

ERNEST W. SWIDER
Attesting Officer

EDWARD J. BRENNER
Commissioner of Patents